United States Patent [19]

Takemae

[11] Patent Number: 4,809,233
[45] Date of Patent: Feb. 28, 1989

[54] PSEUDO-STATIC MEMORY DEVICE HAVING INTERNAL SELF-REFRESH CIRCUIT

[75] Inventor: Yoshihiro Takemae, Tokyo, Japan
[73] Assignee: Fujitsu Limited, Kanagawa, Japan
[21] Appl. No.: 135,102
[22] Filed: Dec. 18, 1987

[30] Foreign Application Priority Data

Dec. 19, 1986 [JP] Japan .................................. 61-301606

[51] Int. Cl.⁴ .............................................. G11C 7/00
[52] U.S. Cl. ...................................... 365/222; 365/230
[58] Field of Search ......................... 365/222, 230, 233

[56] References Cited

U.S. PATENT DOCUMENTS 4,360,903 11/1982 Plachno et al. ...................... 365/222

Primary Examiner—Joseph A. Popek
Attorney, Agent, or Firm—Armstrong, Nikaido, Marmelstein & Kubovcik

[57] ABSTRACT

A pseudo-static memory device includes a memory cell array; a first access circuit for carrying out a sequential access to the word lines in the array to perform a refresh of cells; a second access circuit for bringing one of the word lines to an accessible state in response to an address signal; an access selection circuit for selecting either the first or the second circuit in accordance with an access precedence; a circuit for generating a control signal in response to a change in the address or a change in a level of an external clock; and a delay circuit for delaying the control signal by a predetermined time required for performing the refresh of cells.

The second access circuit performs an address access in response to the delayed control signal irrespective of the operation of the first access circuit, thereby providing a greater allowance for an address skew and a considerable allowance for a lag or lead of the timing of the application of the address signal.

9 Claims, 11 Drawing Sheets

PSEUDO-STATIC MEMORY DEVICE HAVING INTERNAL SELF-REFRESH CIRCUIT

BACKGROUND OF THE INVENTION

1. Field of the Invention

The present invention relates to a pseudo-static memory device and, more particularly, to a pseudo-static random access memory (PSRAM) device internally having dynamic RAM (DRAM) cells and a circuit for automatically carrying out a refresh for the cells, while functioning as a static RAM (SRAM) in appearance.

A PSRAM has been recently developed as a memory having both the advantages of a DRAM, i.e., low cost, and an SRAM, i.e., high integration density, and is widely used in information apparatus such as computers, electronic apparatuses, and the like.

2. Description of the Related Art

A known typical PSRAM device includes an access circuit for internal refresh, an access circuit for external address access, means for selecting either of the access circuits, and a memory cell array. The external address access circuit further includes a circuit for generating a control signal in response to an external signal and a peripheral circuit for carrying out an access to the memory cells in the array in response to the control signal and an address signal. In this case, the address signal is fed to the PSRAM device by another device for feeding the address signal, e.g., a microprocessor. Also, the selecting means generally is arranged to select either the refresh address signal output from the internal refresh access circuit or the external address signal output from the external address access circuit, in accordance with a timing of the input of the address signal.

Therefore, when an internal refresh access is not needed, preferably the external address access operation is carried out as quickly as possible, from the view point of the demands for a high speed operation of the PSRAM device. Therefore, it is necessary for the aforementioned device for feeding the address signal to fed an address signal consisting of a plurality of address bits to the PSRAM device at a high speed. In this case, the following drawback occurs.

In practice the timings of the change in address among the plurality of address bits are not completely uniform; namely, generally a time lag or lead occurs (hereinafter referred to as an address skew). Where the address skew moves outside a permissible range, a drawback occurs in that another memory cell different from the memory cell to be selected, is selected. Therefore, the timing of the address bits must be strictly controlled in the address signal feeding device, and this means that the constitution of the device becomes complicated and the cost thereof rises.

Another PSRAM device is known which employs a low active chip enable signal ($\overline{CE}$) as the aforementioned external signal. In the device, in addition to the above drawback, another drawback occurs in that the timing of the application of the address signal must be strictly set in association with the timing of the application of the external signal ($\overline{CE}$). That is, there is a disadvantage that only a small allowance is made for the address skew.

SUMMARY OF THE INVENTION

An object of the present invention is to provide a pseudo-static memory device capable of providing a greater allowance for an address skew and providing a larger allowance for the lag or lead of a timing of the application of an address signal, without complicating the constitution of a device supplying the address signal.

According to one aspect of the present invention, there is provided a pseudo-static memory device receiving at least an external address signal, the device comprising: a memory cell array having a memory cell provided at each intersection between a plurality of word lines and a plurality of bit lines; a first access circuit for carrying out a sequential access to addresses of the word lines to perform a refresh of the memory cell; a second access circuit for bringing one of the word lines to an accessible state in response to the address signal; an access selection circuit operatively connected between the first access circuit and the second access circuit for selecting any one of the access circuits in accordance with the access sequence and performing an address access by the selected access circuit to the memory cell array; a circuit for generating a control signal in response to a change in address of the address signal; and a delay unit operatively connected between the control signal generating circuit and the second access circuit for delaying the control signal by a predetermined time required for performing the refresh of the memory cell, and feeding the delayed control signal to the second access circuit, whereby the second access circuit performs an address access of word lines in response to the delayed control signal when selected by the access selection circuit.

Also, according to another aspect of the present invention, there is provided a pseudo-static memory device receiving at least an external address signal, the device comprising: a memory cell array having a memory cell provided at each intersection between a plurality of word lines and a plurality of bit lines; a first access circuit for carrying out a sequential access of addresses of the word lines to perform a refresh of the memory cell; a second access circuit for bringing one of the word lines to an accessible state in response to the address signal; an access selection circuit operatively connected between the first access circuit and the second access circuit for selecting any one of the access circuits in accordance with the access sequence and performing an address access by said selected access circuit to the memory cell array; a circuit for generating a control signal in response to a change in level of an external clock signal; and a delay circuit operatively connected between the control signal generating circuit and the second access circuit for delaying the control signal by a predetermined time required for performing the refresh of the memory cell, and feeding the delayed control signal to the second access circuit, whereby the second access circuit performs an address access of word lines in response to the delayed control signal when selected by the access selection circuit.

BRIEF DESCRIPTION OF THE DRAWINGS

Other objects and features of the present invention will be described hereinafter in detail by way of preferred embodiments with reference to the accompanying drawings, in which.

DESCRIPTION OF THE PREFERRED EMBODIMENTS

For a better understanding of the preferred embodiments, the problems in the prior art will now be explained with reference to FIGS. 1 to 7.

Figure 1:
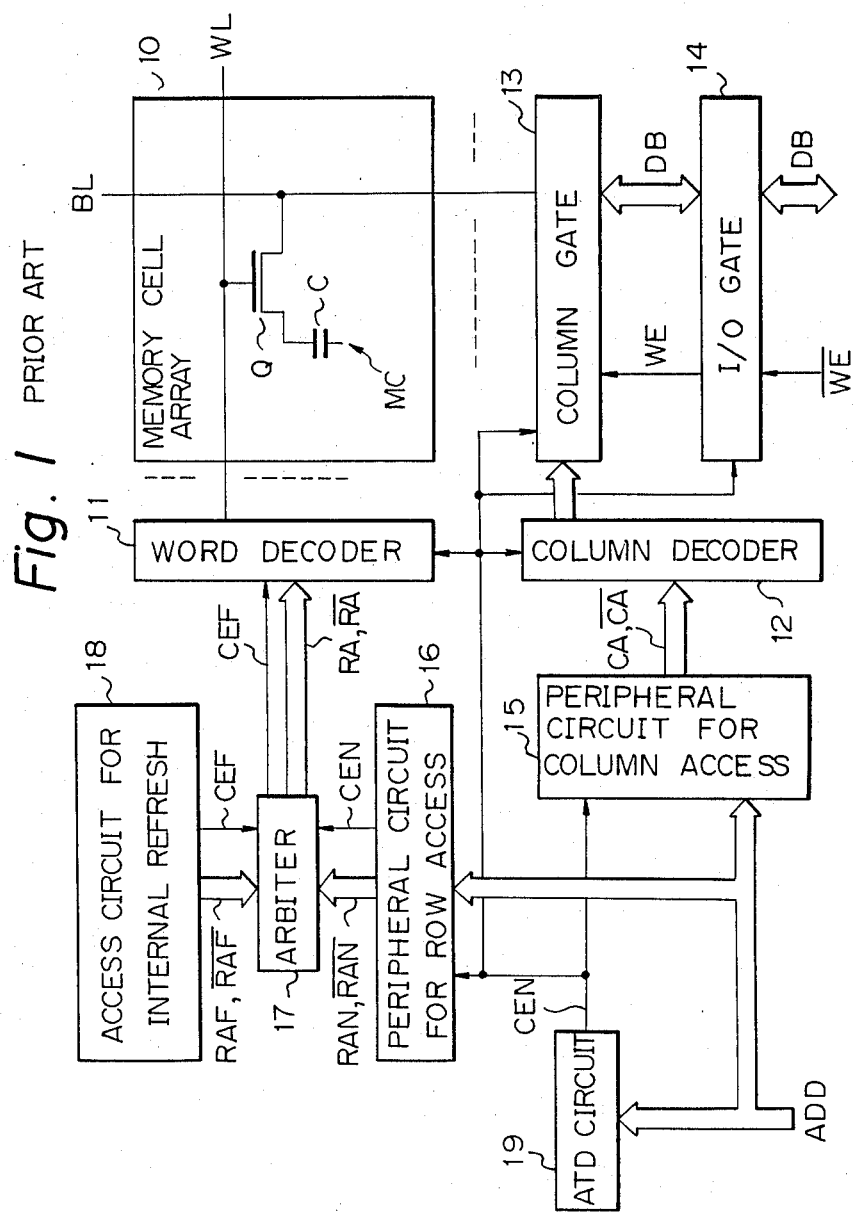
FIG. 1 is a block diagram illustrating an example of a conventional PSRAM device.

FIG. 1 shows an example of a conventional PSRAM device. In FIG. 1, reference 10 denotes a memory cell array having a plurality of DRAM cells MC arranged in a known manner; reference 11 denotes a word decoder which, based on row address signals RA and $\overline{RA}$, selects one of the word lines WL to which the memory cells are connected; and reference 12 denotes a column decoder which, based on column address signals CA and $\overline{CA}$, selects one of the bit lines BL to which the memory cells are connected. When any one of the word lines and any one of the bit lines are selected, it is possible for the corresponding memory cell to read data or write data through a column gate 13 and an input/output (I/O) gate 14.

Reference 19 denotes an address transition detecting (ATD) circuit, which outputs a chip enable signal CEN in response to a change in address of an address signal ADD; reference 15 denotes a peripheral circuit for column access, which outputs the column address signals CA and $\overline{CA}$ in response to the address signal ADD and the chip enable signal CEN; and reference 16 denotes a peripheral circuit for row access, which outputs row address signal RAN and $\overline{RAN}$ in response to the signal ADD and the signal CEN. The address signals RAN and $\overline{RAN}$ are input to an arbiter 17, and the address signal CA and $\overline{CA}$ are input to the column decoder 12.

Reference 18 denotes an access circuit for an internal refresh, which is constituted in a conventional manner, and outputs a refresh enable signal CEF generated at a predetermined time interval and refresh address signals RAF and $\overline{RAF}$. The arbiter 17 selects either the address signals RAN and $\overline{RAN}$ or the refresh address signals RAF and $\overline{RAF}$ in accordance with an input timing of the signals, and feeds the selected signals to the word decoder 11 as row address signals RA and $\overline{RA}$.

Figure 2:
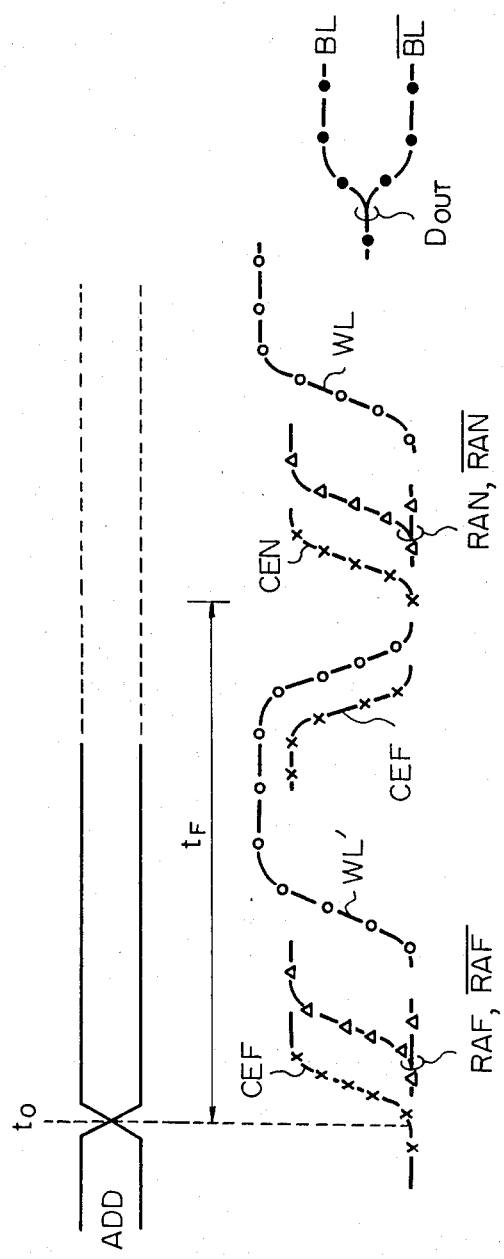
FIG. 2 is a waveform diagram for explaining an access operation of the device shown in FIG. 1, where a refresh access is carried out when an address is changed.

FIG. 2 shows a waveform diagram of an access operation of the device shown in FIG. 1, where a refresh access is carried out when address is changed.

First, when the address signal ADD is changed at a time $t_0$, the refresh enable signal CEF is output, and then the refresh address signals RAF and $\overline{RAF}$ are output. Next, the word line WL' to be refreshed is selected and a prescribed refresh operation is carried out. In FIG. 2, $t_F$ represents a time required for performing a refresh of the memory cells corresponding to a single word line, and the waveforms are shown with respect to a single word line WL', to simplify the explanation.

Note, where the chip enable signal CEN for external access is output some time after the changing time $t_0$ of the address signal, CEN is latched in the peripheral circuit 16 during the aforementioned time interval $t_F$ and becomes valid after the completion of the refresh operation. The subsequent operation is the same as the refresh operation. When the potential of word line WL rises to a predetermined level, the data in the corresponding memory cell is read to the corresponding bit lines BL and $\overline{BL}$.

Also, where the refresh operation has been already carried out at the time $t_0$, the external access operation is carried out after the completion of the refresh operation. That is, the external access operation is started with a longest delay time $t_F$, from the address changing point.

Figure 3:
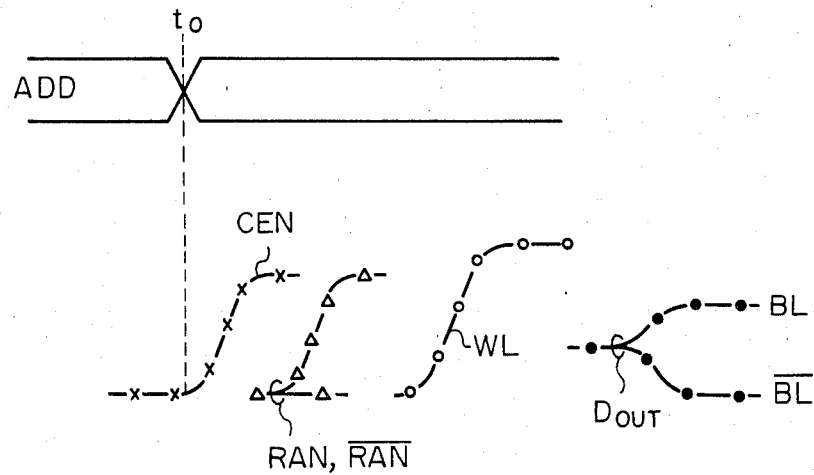
FIG. 3 is a waveform diagram for explaining an access operation of the device shown in FIG. 1, where a refresh access or a refresh operation is not carried out when an address is changed.

FIG. 3 shows a waveform diagram of an access operation of the device shown in FIG. 1, where a refresh access or a refresh operation is not carried out when an address is changed. In this case, the external access operation is carried out at the changing time $t_0$ of the address signal ADD. As a result, the row address signals RAN and $\overline{RAN}$ for external access are output, and then a single word line WL is selected.

Figure 4:
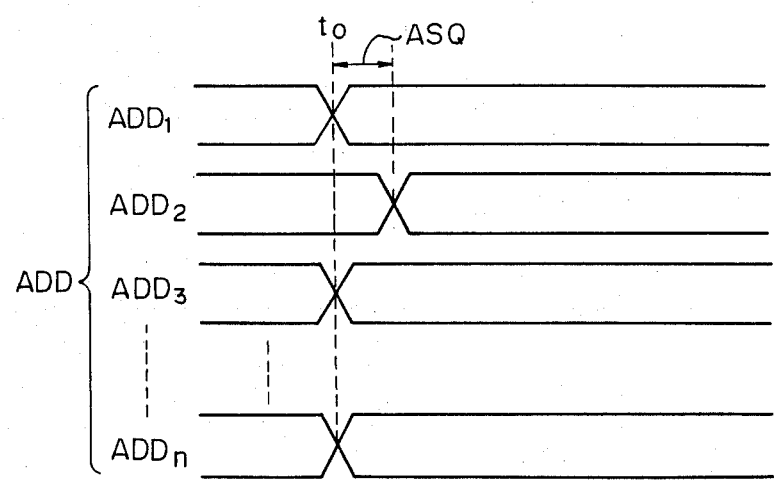
FIG. 4 is a waveform diagram of an address signal for explaining a problem in the device shown in FIG. 1.

The address signal ADD is generally constituted by a combination of a plurality of address bit signals ADD$_1$–ADD$_n$, for example, as shown in FIG. 4. However, it is very difficult to completely uniformalize all of the timings of the changes in address among the plurality of address bit signals and, therefore, generally a time lag or lead occurs, i.e., an address skew ASQ among the bit signals, as shown in FIG. 4. The external access operation shown in FIG. 3 is normally carried out if the address skew ASQ is within a predetermined range. However, where the address skew moves outside the predetermined range, a problem occur in that another word line different from a word line to be selected is selected. Therefore, the timings of the application of each bit of the address signal must be exactly set. However, this causes another problem, in that the constitution of a device (not shown) supplying the address signal ADD becomes complicated, resulting in a rise in the cost thereof.

Figure 5:
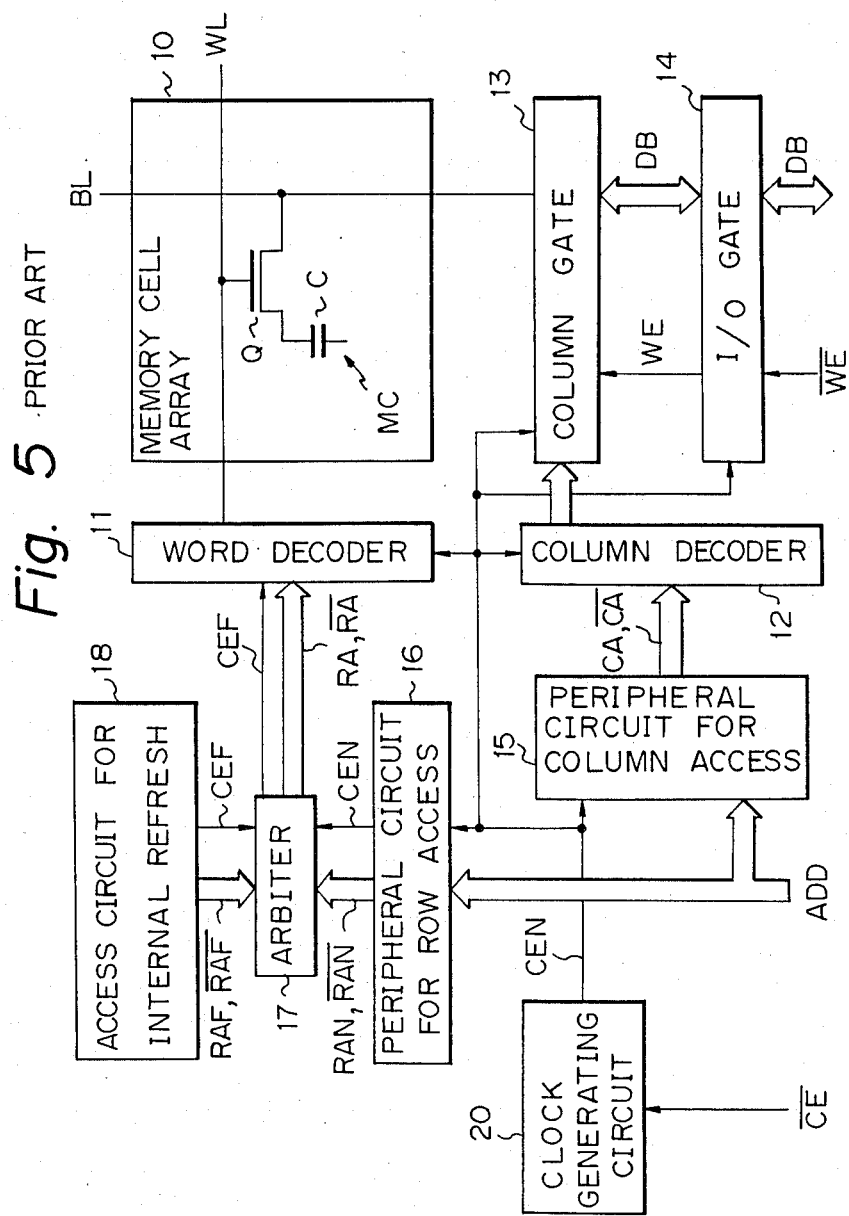
FIG. 5 is a block diagram illustrating another example of a conventional PSRAM device.

FIG. 5 shows another example of a conventional PSRAM device.

The device shown in FIG. 5 is different from that shown in FIG. 1 in that the ATD circuit 19 in FIG. 1 is replaced by a clock generating circuit 20 which outputs a chip enable signal CEN in response to an external clock, i.e., a low active chip enable signal $\overline{CE}$. Other arrangements and the operation thereof are the same as those of the device in FIG. 1 and, accordingly, an explanation thereof will be omitted.

Figure 6:
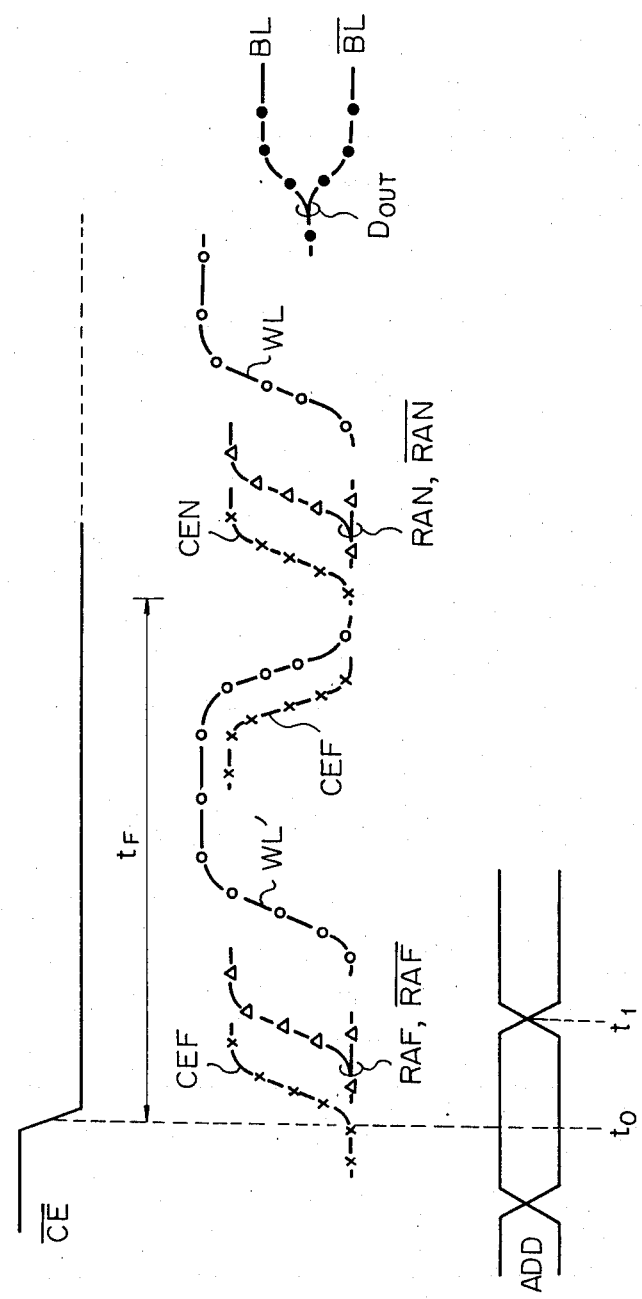
FIG. 6 is a waveform diagram for explaining an access operation of the device shown in FIG. where a refresh access is carried out when the level of an external clock is changed.

FIG. 6 shows a waveform diagram of an access operation of the device shown in FIG. 5, where a refresh access is carried out when the level of the external clock is changed. The mode of operation is the same as that in FIG. 2, but in this case, the external access operation is carried out in accordance with the address information at a time $t_1$, to select the word line WL.

Figure 7:
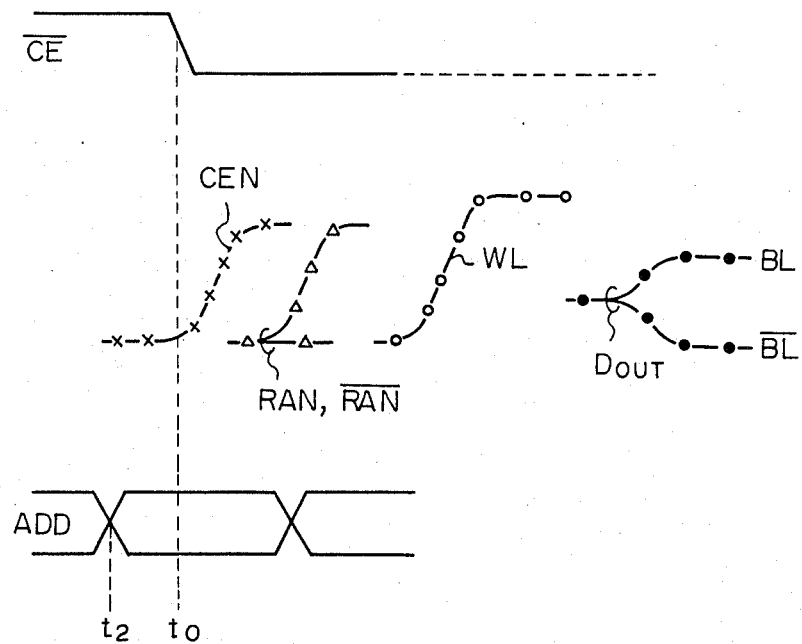
FIG. 7 is a waveform diagram for explaining an access operation of the device shown in FIG. 5 and a problem therein, where a refresh access or a refresh operation is not carried out when the level of an external clock is changed.

FIG. 7 shows a waveform diagram of an access operation of the device shown in FIG. 5, where a refresh access or a refresh operation is not carried out when the level of the external clock is changed. In this case, the external access operation is started in response to a change in the external clock $\overline{CE}$ of from high level to low level, i.e., at the time $t_0$. Accordingly, the address information for selecting the word line WL must be preset, that it can be determined at a time $t_2$ prior to the time $t_0$. In other words, the timing of the application of the address signal ADD must be strictly set in association with the timing of the application of the external clock $\overline{CE}$. This means that the constitution of a device (not shown) supplying the signals ADD and $\overline{CE}$ becomes complicated and the cost thereof is increased, as in FIG. 1.

Preferred embodiments of the present invention will now be described in detail with reference to FIGS. 8 to 12.

Figure 8:
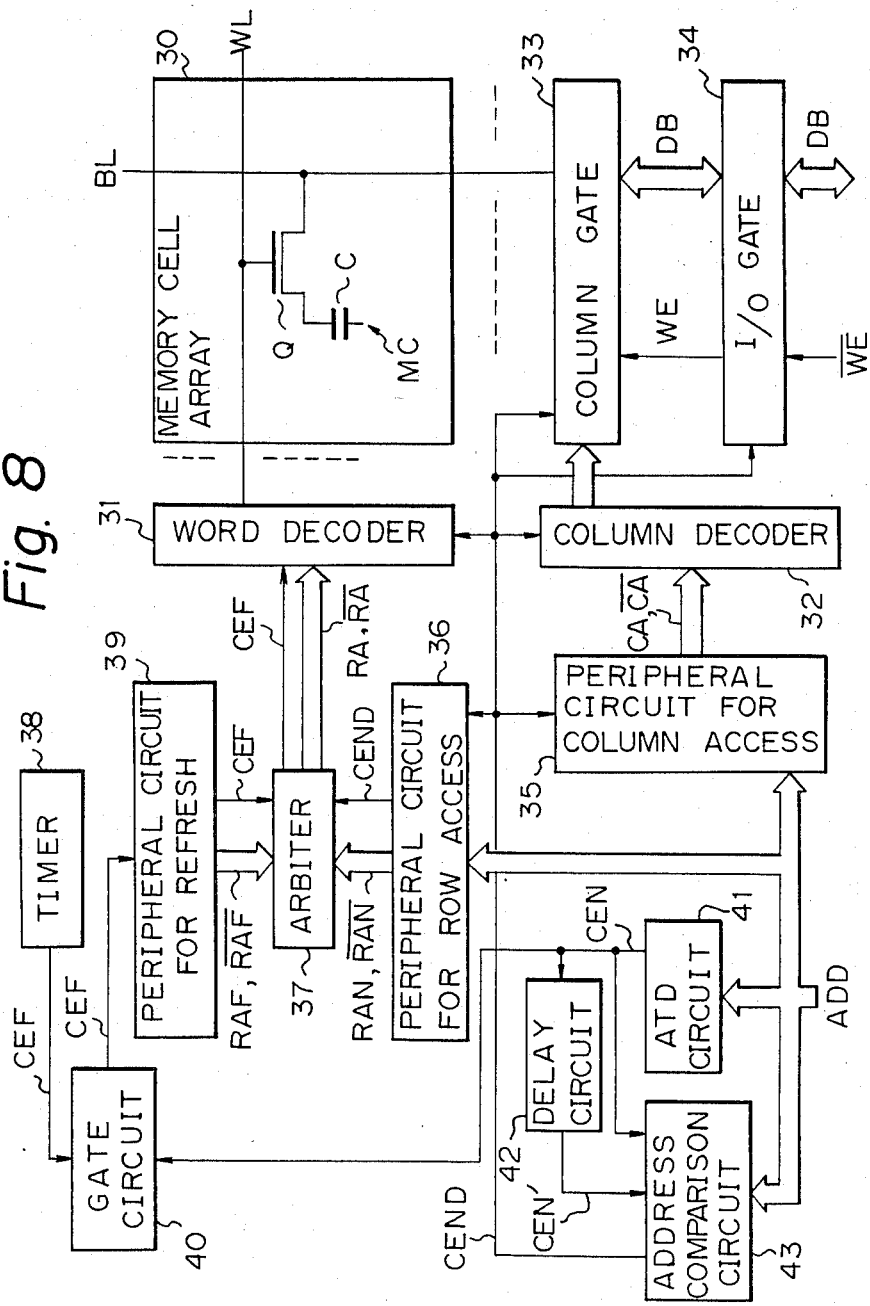
FIG. 8 is a block diagram illustrating an embodiment of the PSRAM device according to the present invention.

FIG. 8 illustrates a block diagram of a PSRAM device as an embodiment of the present invention. In FIG. 8, reference 30 denotes a memory cell array having a dynamic type memory cell MC consisting of one transistor Q and one capacitor C provided at each intersection between a plurality of word lines and a plurality of bit lines. In the illustrated constitution, only a single memory cell is shown, to simplify the explanation. Reference 31 denotes a word decoder which selects the word line WL connected to the memory cell MC based on row address signals RA and $\overline{RA}$, and reference 32 denotes a column decoder which selects via a column gate 33 the bit line BL connected to the memory cell MC based on column address signals CA and $\overline{CA}$. When the word line WL and the bit line BL are selected, the column gate 33 is opened, and thus the data in the memory cell MC can be read through a data bus DB and an I/O gate 34 to the external, or the data from the external can be written or re-written into the cell in response to a low active write enable signal $\overline{WE}$.

Reference 35 denotes a peripheral circuit for column access which outputs the column address signals CA and $\overline{CA}$ in response to an address signal ADD and a delayed chip enable signal CEND, and reference 36 denotes a peripheral circuit for row access which outputs row address signals RAN and $\overline{RAN}$ in response to the signal ADD and the signal CEND. The address signals RAN and RAN are input to an arbiter 37, and the address signals CA and $\overline{CA}$ are input to the column decoder 32.

Reference 38 denotes a timer which generates a refresh enable signal CEF for performing a refresh of the memory cells corresponding to one word line at a predetermined time interval, and reference 39 denotes a peripheral circuit for a refresh which outputs refresh address signals RAF and $\overline{RAF}$ in response to the refresh enable signal CEF. Also, reference 40 denotes a gate circuit connected between the timer 38 and the peripheral circuit 39, and controlling the transmission of the refresh enable signal CEF to the peripheral circuit 39 in response to a chip enable signal CEN. In the present example, the gate circuit 40 transmits the refresh enable signal CEF when the signal CEF is input prior to the chip enable signal CEN, and prohibits the transmission until an external address access based on the chip enable signal CEN is completed, when the signal CEN is input prior to the refresh enable signal CEF. Also, the peripheral circuit 39 includes an address counter (not shown) which performs a sequentially renewal of addresses of the word lines based on the signal CEF from the timer 38. Thus, a sequential access to a plurality of word lines is carried out. The timer 38, peripheral circuit 39 and gate circuit 40 constitute an internal refresh circuit.

The arbiter 37 selects either the address signals RAF and $\overline{RAF}$ from the peripheral circuit 39 for refresh and the address signals RAN and $\overline{RAN}$ from the peripheral circuit 36 for row access in accordance with an input timing of the signals, and supplies the selected signals to the word decoder 31 as row address signals RA and $\overline{RA}$. . A concrete example of the constitution of the arbiter 37 will be described later.

Reference 41 denotes an ATD circuit which outputs the chip enable signal CEN in response to a change in address of the address signal ADD, and reference 42 denotes a delay circuit for delaying the chip enable signal CEN by a predetermined time to form a delay signal CEN'. Also, reference 43 denotes an address comparison circuit which receives the address signal ADD, the chip enable signal CEN from the ATD circuit 41, and the delay signal CEN' from the delay circuit 42. The address comparison circuit 43 retains an address information corresponding to the chip enable signal CEN upon receipt of the signal CEN, and retains an address information corresponding to the delay signal CEN' upon receipt of the signal CEN', compares the address information of both, and outputs the delayed control signal CEND when the address information of both are in accord. Namely, the delayed control signal CEND is generated when a change does not occur in the information of the address signal ADD during the time from the generation of the signal CEN to the generation of the signal CEN'.

The time required for the generation of the delayed control signal CEND after the generation of the chip enable signal CEN is made equal to the time required for carrying out the refresh of the memory cells corresponding to one word line. The delayed control signal CEND is supplied to the word decoder 31, column decoder 32, column gate 33, I/O gate 34, peripheral circuit 35 for column access, and peripheral circuit 36 for row access. Note, where the address information of both based on the signals CEN and CEN' are not in accord, the generation of the signal CEND is inhibited until the address information of both are in accord.

Figure 9:
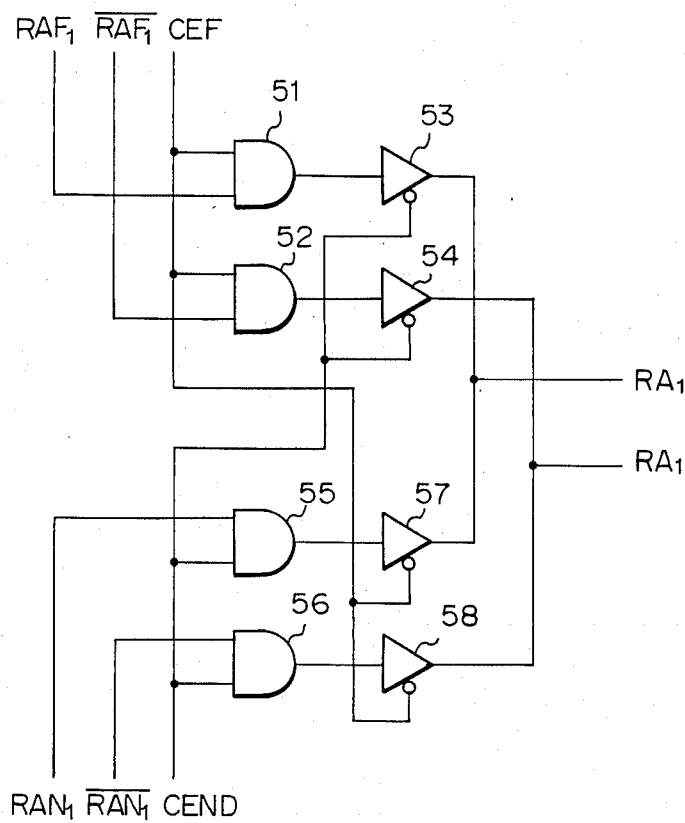
FIG. 9 is a circuit diagram illustrating an example of the constitution of a part of the arbiter shown in FIG. 8.

FIG. 9 illustrates a circuit constitution of a part of the arbiter 37 shown in FIG. 8. The circuit in FIG. 9 is shown with respect to one address bit of the address signal.

In FIG. 9, a pair of complementary address bits $RAF_1$ and $\overline{RAF}_1$ of the refresh address signal are input to one input end of AND gates 51 and 52, respectively, and the refresh enable signal CEF is input to another input end of each of the AND gates 51 and 52. Reference 53 denotes a tristate buffer, which prohibits the transmission of the signal output from the AND gate 51, i.e., the address bit signal $RAF_1$, in response to the delayed control signal CEND. Similarly, reference 54 denotes a tristate buffer, which prohibits the transmission of the address bit signal $RAF_1$, in response to the signal CEND. A pair of complementary address bits RAN and $RAN_1$ of the row address signal are input to one input end of AND gates 55 and 56, respectively, and the delayed control signal CEND is input to another input end of each of AND gates 55 and 56. Reference 57 denotes a tristate buffer, which prohibits the transmission of the address bit signal $RAN_1$, in response to the refresh enable signal CEF. Similarly, reference 58 denotes a tristate buffer, which prohibits the transmission of the address bit signal $RAN_1$, in response to the signal CEF.

As is concretely shown in the circuit constitution in FIG. 9, the arbiter selects the refresh address bits $RAF_1$ and $RAF_1$ as the access address bits $RA_1$ and $RA_1$ when the refresh enable signal CEF is input prior to the delayed control signal CEND. Conversely, when the signal CEND is input prior to the signal CEF, the arbiter selects the row address bits $RAN_1$ and $RAN_1$ as the access address bits $RA_1$ and $RAN_1$.

Figure 10:
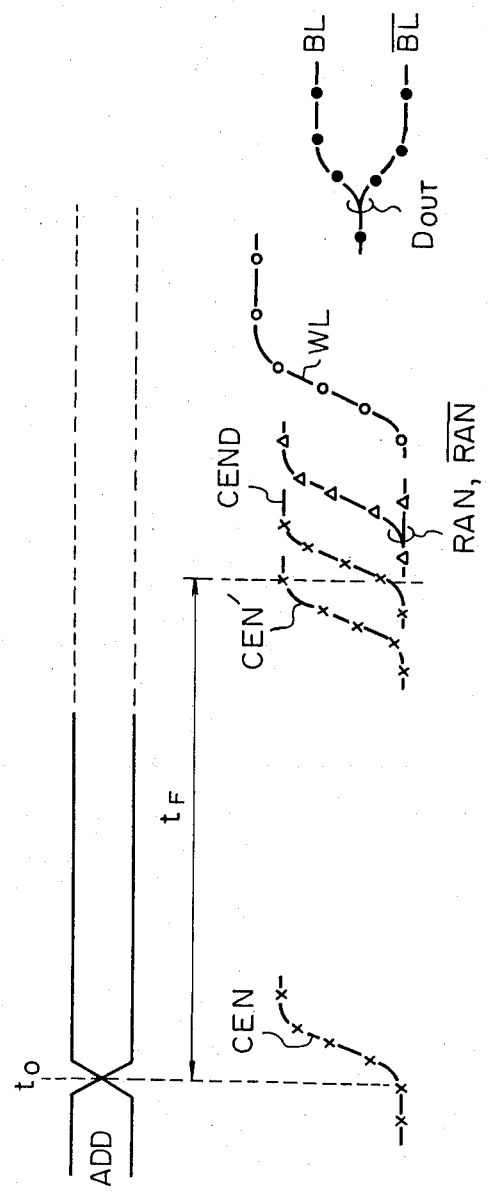
FIG. 10 is a waveform diagram for explaining an example of the access operation of the device shown in FIG. 8.

FIG. 10 shows a waveform diagram of an example of the access operation of the device shown in FIG. 8, where a refresh access or a refresh operation is not carried out when an address is changed.

First, when the chip enable signal CEN is generated in response to a change in the address signal ADD, i.e., at the time $t_0$, the delay circuit 42 delays the chip enable signal CEN by a predetermined time to form the delay signal CEN'. Since the address signal ADD is not changed during the time from the generation of the signal CEN to the generation of the signal CEN', the delayed control signal CEND is output from the address comparison circuit 43. When the signal CEND is generated, and the peripheral circuits 35 and 36 output the column address signals CA, $\overline{CA}$ (not shown) and the row address signals RAN, $\overline{RAN}$, respectively. The row address signals RAN, $\overline{RAN}$ are fed via the arbiter 37 to the word decoder 31 as the signals RA, $\overline{RA}$. Each circuit indicated by references 31 to 34 operates, in response to the delayed control signal CEND, and thus the address access is carried out. When the potential on the word line WL rises to a predetermined level, the data in the corresponding memory cell is read to the bit lines BL and BL.

Note, where the refresh operation has been already carried out at the time $t_0$ of the address change, the external access operation is carried out after the completion of the refresh operation. In this case, however, the external access operation is started at a time delayed from the time $t_0$ by the time $t_F$, not immediately after the completion of the refresh operation.

Also, where the refresh access is carried out some time prior to the time $t_0$, from the time $t_0$, the refresh operation takes precedence over the external access operation. After the completion of the refresh operation, i.e., at the time delayed from the time $t_0$ by the time $t_F$, the external access operation is started.

As explained above, in the device of the embodiment in FIG. 8, the problem due to an address skew at the address change, e.g., an incorrect selection of a word line, can be solved, because a sufficient time $t_F$ is given as the time interval from the time of the address change to the time of the actual address access.

Figure 11:
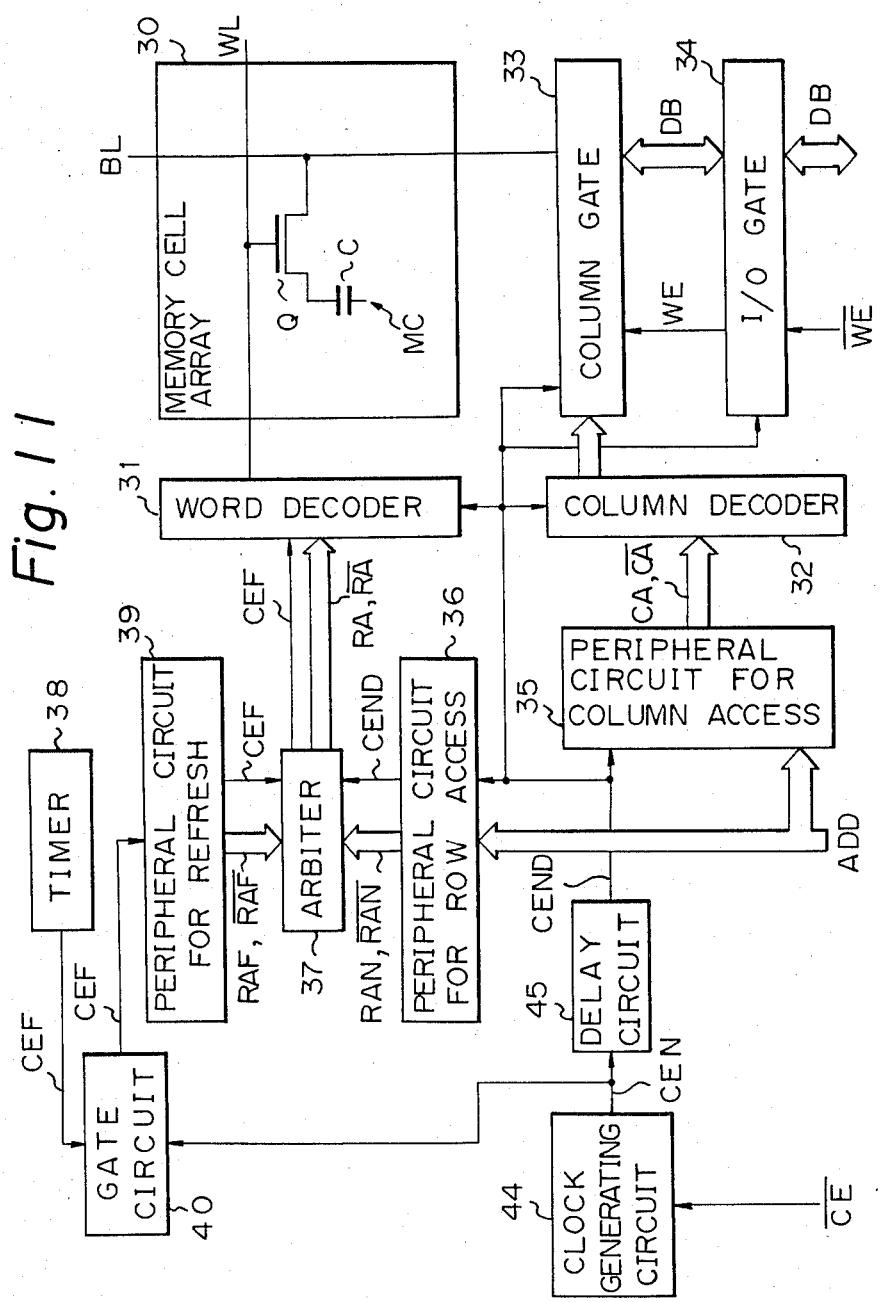
FIG. 11 is a block diagram illustrating another embodiment of the PSRAM device according to the present invention.

FIG. 11 illustrates a block diagram of a PSRAM device as another embodiment of the present invention.

The constitution of the device in FIG. 11 is almost the same as that in FIG. 8 except that the ATD circuit 41, delay circuit 42 and address comparison circuit 43 employed in the device in FIG. 8, are replaced by a clock generating circuit 44 for outputting the chip enable signal CEN in response to a low active chip enable signal $\overline{CE}$ and a delay circuit 45 for delaying the signal CEN by the predetermined time $t_F$, and feeding the delayed signal to the peripheral circuits 35 and 36 as the delayed control signal CEND. Other arrangements and the operation of the device in FIG. 11 are the same as those in the device in FIG. 8 and, accordingly, an explanation thereof will be omitted.

Figure 12:
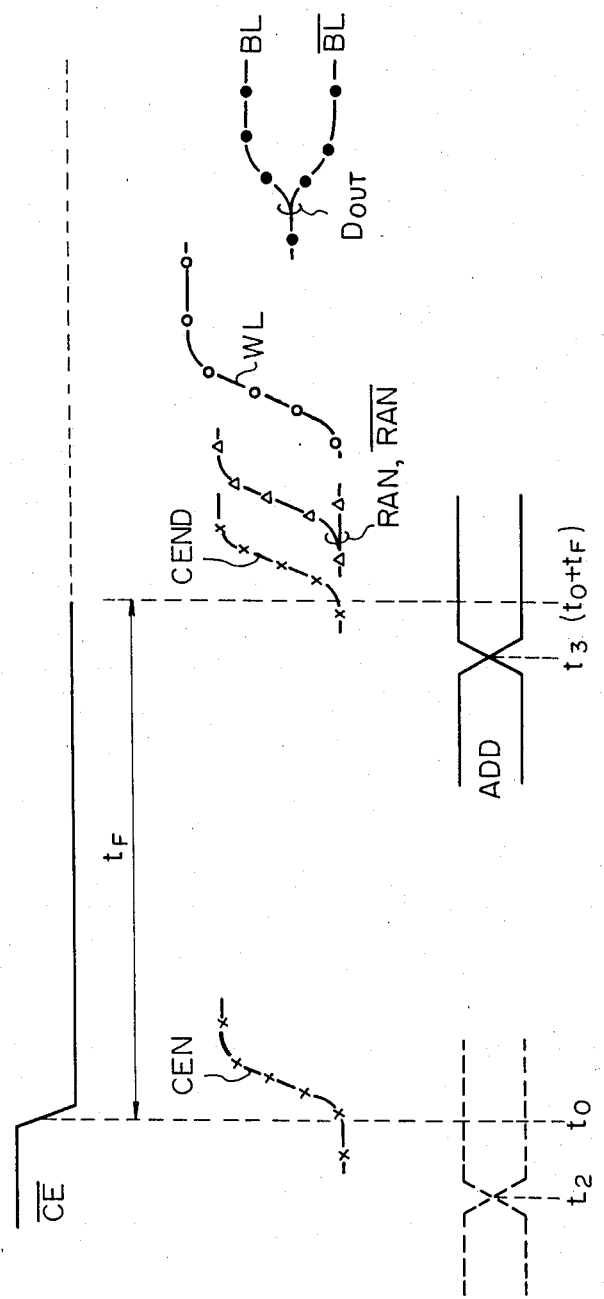
FIG. 12 is a waveform diagram for explaining an example of the access operation of the device shown in FIG. 11.

FIG. 12 shows a waveform diagram of an example of the access operation of the device shown in FIG. 11, where a refresh access or a refresh operation is not carried out when the level of an external clock CE is changed.

First, when the chip enable signal CEN is generated in response to a change from high level to low level of the external clock $\overline{CE}$, i.e., at the time $t_0$, preparation for the external access operation is made. At the same time, the gate circuit 40 is closed in response to the signal CEN, and thus the refresh access is prohibited. Also, the delay circuit 45 delays the signal CEN by the predetermined time $t_F$, i.e., the time required for performing a refresh of the memory cells corresponding to one word line, and outputs the delayed signal as the delayed control signal CEND. Each circuit indicated by references 31 to 36 operates in response to the signal CEND, and thus the address access is carried out. The column address signals CA, $\overline{CA}$ (not shown) and the row address signals RAN, $\overline{RAN}$ are output and the potential on the word line WL rises, and as a result, the data in the corresponding memory cell is read to the bit lines BL and $\overline{BL}$.

Therefore, the time $t_3$ of the address change in the address single ADD can be arbitrarily set within the range between the time $t_0$ and the time $(t_0+t_F)$, because sufficient time $t_F$ is assured as the time interval from the time of the change in the level of the clock $\overline{CE}$ to the time of the actual address access. Namely, as in the prior art (shown by a broken line), it is not necessary to preset the address information at a time $t_2$ prior to the time $t_0$ of the change in the level of the clock $\overline{CE}$. Accordingly, it is possible to make a large allowance for the lag or lead of the timing of that application of the address signal.

Note, the access operation where the refresh operation has been already carried out at the time $t_0$ of the change in the level of the external clock $\overline{CE}$, or the access operation where the refresh access is carried out some time prior to the time $t_0$, is the same as that of the device in FIG. 8, and thus an explanation thereof will be omitted.

Although the present invention has been disclosed and described by way of only two embodiments, it is apparent to those skilled in the art that other embodiments and modifications of the present invention are possible without departing from the spirit or essential features thereof.

I claim:

1. A pseudo-static memory device receiving at least an external address signal, said device comprising:
   a memory cell array having a memory cell provided at each intersection between a plurality of word lines and a plurality of bit lines;

a first access circuit for carrying out a sequential access of addresses of said word lines to perform a refresh of said memory cell;

a second access circuit for bringing one of said word lines to an accessible state in response to said address signal;

an access selection circuit operatively connected between said first access circuit and said second access circuit for selecting any one of said access circuits in accordance with said access sequence and performing an address access by said selected access circuit to said memory cell array;

a circuit for generating a control signal in response to a change in address of said address signal; and a delay means operatively connected between said control signal generating circuit and said second access circuit for delaying said control signal by a predetermined time required for performing said refresh of said memory cell, and feeding said delayed control signal to said second access circuit, whereby said second access circuit performs an address access of word lines in response to said delayed control signal when selected by said access selection circuit.

2. A device as set forth in claim 1, wherein said first access circuit includes a peripheral circuit for refresh for outputting a refresh enable signal and refresh address signals, and said second access circuit includes a peripheral circuit for row access for transmitting said delayed control signal to said access selection circuit and outputting row address signal, whereby said access selection circuit selects one of said refresh address signals and said row address signals in accordance with a preceding generation of said refresh enable signal and said delayed control signal.

3. A device as set forth in claim 2, wherein said first access circuit further includes a timer for generating said refresh enable signal at a predetermined time interval and a gate circuit connected between said timer and said peripheral circuit for refresh and responding to said control signal, said gate circuit transmitting said refresh enable signal to said peripheral circuit for refresh when said refresh enable signal is generated before said control signal.

4. A device as set forth in claim 3, wherein said gate circuit prohibits a transmission of said refresh enable signal to said peripheral circuit for refresh until an external address access based on said control signal is finished, when said control signal is generated before said refresh enable signal.

5. A device as set forth in claim 1, wherein said delay means includes a delay circuit for delaying said control signal by a predetermined time to form a delay signal and an address comparison circuit for receiving said address signal, said control signal and said delay signal, comparing an address corresponding to said control signal with an address corresponding to said delay signal, and outputting said delayed control signal when both of said addresses are in accord.

6. A pseudo-static memory device receiving at least an external address signal, said device comprising:

a memory cell array having a memory cell provided at each intersection between a plurality of word lines and a plurality of bit lines;

a first access circuit for carrying out a sequential access of addresses of said word lines to perform a refresh of said memory cell;

a second access circuit for bringing one of said word lines to an accessible state in response to said address signal;

an access selection circuit operatively connected between said first access circuit and said second access circuit for selecting any one of said access circuits in accordance with said access sequence and performing an address access by said selected access circuit to said memory cell array;

a circuit for generating a control signal in response to a change in a level of an external clock signal; and a delay circuit operatively connected between said signal generating circuit and said second access circuit for delaying said control signal by a predetermined time required for performing said refresh of said memory cell, and feeding said delayed control signal to said second access circuit, whereby said second access circuit performs an address access of word lines in response to said delayed control signal when selected by said access selection circuit.

7. A device as set forth in claim 6, wherein said first access circuit includes a peripheral circuit for refresh for outputting a refresh enable signal and refresh address signals, and said second access circuit includes a peripheral circuit for row access for transmissing said delayed control signal to said access selection circuit and outputting row address signals, whereby said access selection circuit selects one of said refresh address signals and said row address signals in accordance with a preceding generation of said refresh enable signal and said delayed control signal.

8. A device as set forth in claim 7, wherein said first access circuit further includes a timer for generating said refresh enable signal at a predetermined time interval and a gate circuit connected between said timer and said peripheral circuit for refresh and responding to said control signal, said gate circuit transmitting said refresh enable signal to said peripheral circuit for refresh when said refresh enable signal is generated before said control signal.

9. A device as set forth in claim 8, wherein said gate circuit prohibits a transmission of said refresh enable signal to said peripheral circuit for refresh until an external address access based on said control signal is finished, when said control signal is generated before said refresh enable signal.

* * * * *